United States Patent [19]

Masters et al.

[11] 4,316,946

[45] Feb. 23, 1982

[54] SURFACE SENSITIZED CHALCOGENIDE PRODUCT AND PROCESS FOR MAKING AND USING THE SAME

[75] Inventors: Joseph I. Masters, Cambridge; Gershon M. Goldberg, Arlington; Jerome M. Lavine, Lincoln, all of Mass.

[73] Assignee: Ionomet Company, Inc., Brighton, Mass.

[21] Appl. No.: 99,581

[22] Filed: Dec. 3, 1979

[51] Int. Cl.³ .......................... G03C 1/76; G03C 5/00
[52] U.S. Cl. ......................................... 430/9; 430/495; 430/271; 430/273; 430/325; 430/326
[58] Field of Search ............... 430/271, 273, 325, 326, 430/495, 9, 16, 270, 313; 427/343

[56] References Cited

U.S. PATENT DOCUMENTS 3,058,845 10/1962 Hendricks ........................... 427/343
3,637,383 1/1972 Hallman et al. ..................... 430/322
3,996,057 12/1976 Kawaziri et al. .................... 430/353

OTHER PUBLICATIONS

"A Novel Inorganic Photoresist Utilizing Ag Photo-doping in Se–Ge Glass Films", Applied Physics Letters, vol. 29, No. 10, Nov. 15, 1976, pp. 677–679.

*Primary Examiner*—Won H. Louie, Jr.
*Attorney, Agent, or Firm*—Frank A. Steinhilper

[57] ABSTRACT

Surface sensitization of a chalcogenide glass is achieved by depositing an extremely thin silver layer, for example, by depositing a silver halide and developing and fixing in the absence of exposure. The sensitized chalcogenide can then be exposed to light to make it etch-resistant. Further exposure reverses the etch resistance, permitting positive or negative images and permitting erasure. Microlithographic resists such as masks can be formed.

12 Claims, 8 Drawing Figures

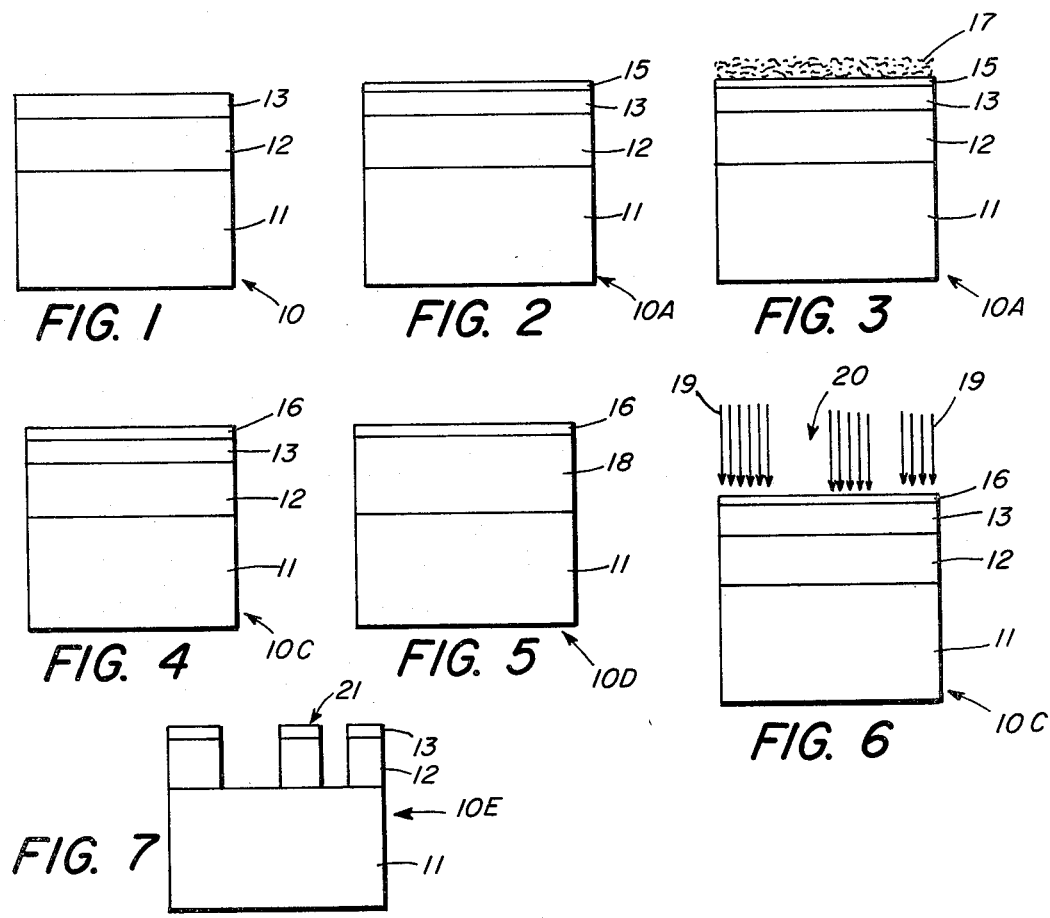
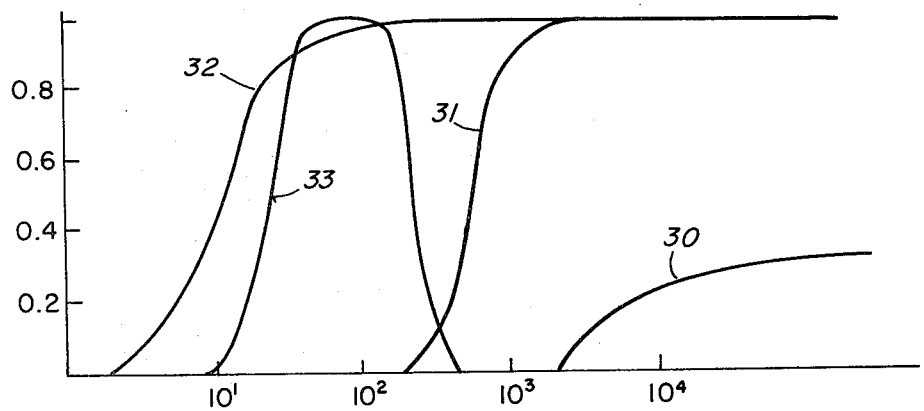

SURFACE SENSITIZED CHALCOGENIDE PRODUCT AND PROCESS FOR MAKING AND USING THE SAME

BACKGROUND OF THE INVENTION

In recent years, it has been found that chalcogenide glasses such as arsenic trisulfide, selenium-germanium glasses and the like are useful for producing resists and for related purposes. These glasses can be placed on suitable substrates in very thin layers and, being amorphous, they have very uniform physical characteristics. They can be readily etched into resist designs: after exposure to a light image or other activating radiation image the chalcogenide glass itself has an image which is differentially resistant to an alkaline etch.

More recently, it has been found that an image of silver on a chalcogenide glass layer can be diffused into or driven into the surface of the glass by light, heat, or preferably, infra red or similar radiation. The silver image has been produced by depositing a silver halide on the glass, exposing it photographically to a pattern to be reproduced and developing it, thus converting some of the silver halide to silver. The silver halide does not respond to infra red radiation while the reduced silver is driven into the surface of the chalcogenide glass thus forming an image configuration of a hard or etch resistant cap on the glass. In our prior application Ser. No. 86,198, which is a continuation-in-part of Ser. No. 57,183, filed July 13, 1979, a silver halide deposit on the chalcogenide glass surface is exposed to activating radiation and is photographically developed and processed to produce a silver image on the glass. This image is then used to provide an etch resistant cap at the glass surface. The silver required for cap formation can be generated by a relatively short exposure to a light image, or by a relatively short exposure to other activating radiation such as electron beam writing or the like, followed by development.

Resists formed in this way are useful for various micro-resist purposes, including microlithographic purposes; one particularly valuable consequence is the ability to form particularly fine-resolution masks for semiconductor production.

GENERAL NATURE OF THE INVENTION

According to the present invention, the chalcogenide glass itself is surface sensitized or made photographically active by treating its surface with activated silver. The treated glass can be exposed to a pattern of light and shadow to form selectively a pattern in the form of a hardened etch resistant cap. The exact mechanism is not now known, but it is believed that the activated silver under the action of light, penetrates into the very top of the chalcogenide glass and combines with the glass to produce a very thin top layer of altered composition.

The etch resistant cap formed according to the present invention differs from caps of the prior art at least in that it is photographically reversible. As will be shown in FIG. 8, exposure of the activated chalcogenide glass to an initial quantity of radiation produces etch resistance; continued exposure then reverses the cap formation. Consequently, this activated chalcogenide glass can be normally exposed to a pattern of light and shadow to form a selective etch resistant glass, the exposed areas being etch resistant. In the alternative, the entire surface can be preliminarily uniformly exposed or flooded with radiation and subsequently exposed to a line pattern: in this case, patternwise the exposed areas are etch-sensitive. Also, a resist or mask or the like may be formed and subsequently removed by further exposure and etching.

In the optimum etching process, it is desirable, in order to obtain high resolution line patterns to retain high contrast of the relief image whereby regions unexposed to imaging radiation etch to completion rapidly, thereby minimizing the time that exposed regions must remain totally etch resistant. To facilitate such differential etching, the chalcogenide deposit may be a laminate with a normal top layer over a bottom layer which has been treated so as to etch rapidly. For example, a 3000 Å deposit may be constructed as follows. A 2500 Å bottom layer is vapor deposited and this layer during or after deposition is exposed to a sufficient amount of U.V. flood lighting known to noticeably increase the chalcogenide etch rate. The top 500 Å of the chalcogenide, however, is deposited as usual with safe lighting. Therefore, the total etching time of the chalcogenide laminate in regions unexposed to imaging light will be noticeably reduced because of accelerated etching in the 2500 Å base layer.

The nature of the invention may be more clearly understood with reference to the drawings in which:

FIG. 1 is a diagrammatic sectional view of an intermediate resist element according to one embodiment of the invention;

FIG. 2 is a like view of the element of FIG. 1 after an additional process operation;

FIG. 3 is a like view of the element of FIG. 1 during a next subsequent process operation;

FIG. 4 is a like view of the element of FIG. 1 after preliminary process operations;

FIG. 5 is a like view of a resist element in the same production stage as that of FIG. 4, this element being in accordance with another embodiment of the invention;

FIG. 6 is a like view of the element of FIG. 5 during exposure;

FIG. 7 is a like view of a manufactured resist according to one embodiment of the invention;

FIG 8 is a graph of the exposure response of instant element compared with prior art elements.

SPECIFIC DESCRIPTION OF THE INVENTION

In FIG. 1 is shown an intermediate resist element generally designated 10 including a suitable substrate member 11 such as glass, quartz or the like. On the surface of the substrate 11 is a first layer 12 which may be a chalcogenide glass such as arsenic trisulfide, selenium germanium or the like. This first layer is characterized by being readily susceptible to etching and can be formed by the deposition of arsenic trisulfide in the presence of significant ultraviolet illumination. On this first layer 12 is an upper layer 13 which may be conventionally vacuum deposited arsenic trisulfide.

In FIG. 2 is shown a subsequent resist element generally designated 10A, including substrate member 11, layer 12 and layer 13 as in previous element 10. On the surface of upper layer 13 is a layer 15 of a silver halide, such as may be formed by vacuum deposition of one of the silver halides or a mixture of silver halides.

In FIG. 3 is shown the resist element 10A of FIG. 2 during a subsequent processing operation. Shown in FIG. 3 is the element 10A with a layer or bath 17 of a photographic developer in contact with the silver halide deposit 15. At the time of development, the silver halide has not been exposed to light or similar radiation. As a result, the photographic developer only slowly reduces silver halide to silver. Development in this operational step is continued to form a very thin silver layer (see FIG. 4) which may, for example, be in the range of about 10 Å to somewhat less than 100 Å.

In FIG. 4 is shown a surface sensitized resist element generally designated 10C, having a substrate 11, a lower layer of etch-susceptible material 12, an upper layer of chalcogenide glass 13 and a sensitizing thin coating of silver 16. In one embodiment of the invention the silver layer has been formed through the deposition of a silver halide on a chalcogenide glass layer followed by photographic development and fixing without exposure.

In FIG. 5 is shown an element 10D which is counterpart of element 10C, except that element 10D has a single chalcogenide glass layer 18 on a substrate 11 with a thin silver coating 16 on the surface of the chalcogenide glass. The single layer 18 may be made, for example, by vacuum evaporation of the chalcogenide glass such as arsenic trisulfide on a suitable substrate, the evaporation being carried out in darkness or under safe-light conditions. The silver layer 16 may be formed in the same manner as layer 16 of FIG. 4.

As shown in FIG. 6, element 10C is exposed to a suitable light image pattern of activating radiation, such as areas 19 of light and areas 20 of shadow. The pattern may be any appropriate pattern for a resist, including for example, an electron beam pattern which may be used to make a mask for semiconductor manufacture.

After element 10C is exposed, it is then etched, for example in strong ammonium hydroxide or other etching bath ordinarily employed for chalcogenide glasses or other etchable layers. In FIG. 7 is shown a relief pattern of etch resisting areas 21 corresponding to the exposed pattern areas (areas 19 in FIG. 6). When the correct level of exposure has acted on layer 13, its surface becomes selectively etch resistant corresponding to the quantity of activating radiation to which the layer 13 was subjected. The exposed areas of layer 13 thus forms an effective etch resisting cap which protects both layer 13 and the underlying layer 12 from etching.

In FIG. 8 is shown diagrammatically the exposure response of the surface sensitization element in comparison with several prior chalcogenide materials and processes. The chart shows photographic exposure response in terms of the fraction of material remaining after a reproducible standard etch as a consequence of the amount of exposure. It is expressly observed that exposure is presented in units representing powers of ten, and that equal units represent tenfold differences of intensity or time of exposure. The units of exposure in FIG. 8 are approximate. In FIG. 8, chart or line 30 illustrates, in effect, the photographic speed of simple direct exposure of an arsenic trisulfide layer to a mercury arc light source. As illustrated, an exposure of about $1\times10^4$ mJ/cm$^2$ will produce a resist in which about 25% of the chalcogenide will remain after etching. The deposition of a simple layer of silver, vacuum evaporated onto the surface provides full density at the same exposure level, as shown in chart or line 31, with useful resists being formed from exposures of about $1\times10^3$ mJ/cm$^2$. This procedure is illustrated by Yoshikawa et al, "A novel inorganic photoresist utilizing Ag photodoping in Se-Ge glass films", Applied Physics Letters, Vol. 29, No. 10, Nov. 15, 1976, pages 677-679. In a system disclosed in copending application Ser. No. 86,198, filed Oct. 17, 1979, and its parent application Ser. No. 57,183 filed July 13, 1979 a much faster photographic speed is achieved, as is shown in chart or line 32 of FIG. 8. Very good etch resistance is produced by exposure levels of 10 mJ/cm$^2$ and nearly full resistance to the etch is produced with about $1\times10^2$ mJ/cm$^2$.

In each of these three cases essentially full etch resistance is retained as exposure levels are greatly increased.

In contradistinction from these prior results, the photosensitivity of the present invention is illustrated in chart or line 33 of FIG. 8. As shown, essentially full etch resistance is obtained by exposures of about $1\times10^2$ mJ/cm$^2$. This etch resistance reverses down to nearly zero when the exposure substantial exceeds that which is required to produce etch resistance. As a result of the reversing etch resistance shown in line 33, two new options are created. A resist may be formed after a first exposure to produce a pattern of etch resistance, and the resist appropriately utilized. Thereafter, a subsequent exposure can create etch sensitivity in part or all of the resist, whereupon a further etch will permit erasure of the resist in part or in whole to amend or destroy it.

According to the second option large areas, or the entire area of the surface sensitized chalcogenide, may be fogged or exposed, and then exposed to an image pattern of radiation to form a photographic reversal image in the resist.

Following is a specific example of one procedure for carrying out the present invention.

A suitable substrate such as a small glass, quartz or other support base 11 is placed in a conventional vacuum evaporation system which is then evacuated to a pressure around $5\times10^{-5}$ or $1\times10^{-6}$ Torr. A layer of arsenic trisulfide is evaporated from a molybdenum boat onto the substrate at the rate of about 1 to 5 Å thickness per second, in the present of ultraviolet illumination, to form a layer about 2500 Å thick. The ultraviolet illumination is then turned off and evaporation is continued to deposit an additional layer of arsenic trisulfide about 500 Å thick. This is the element of FIG. 1.

The substrate with the arsenic sulfide coating is transferred to another vacuum evaporation system, again evacuated to about $5\times10^{-5}$ or $1\times10^{-6}$ Torr, and a silver halide layer chosen from silver chloride, silver bromide, or mixtures of the chloride and bromide is evaporated onto the arsenic trisulfide surface. The silver halide is evaporated from a tungsten boat held at 675° C. to form a layer of silver halide between about 200 Å and about 1500 Å thick, generally about 600 Å to about 1200 Å. This the element of FIG. 2.

The resulting element is developed (See FIG. 3) for approximately one minute at room temperature in a photographic developer having the following composition:

| | |
|---|---|
| hydroquinone | 2.5g/1000 ml. |
| p-methylaminophenol sulfate | 0.67 |
| sodium sulfite | 26 |
| sodium carbonate | 26 |
| gelatin | 1.67 |

Development under these conditions is quantitatively sufficient to deposit a layer of silver having a thickness of about 20 Å.

After development, the element is fixed in a photographic fixer to remove unreduced silver halide. The resulting product is the element of FIG. 4, having a substrate 11, a laminate of softer arsenic trisulfide 12 and of unsoftened arsenic trisulfide 13 and a very thin silver layer 15 thereon.

This element is then exposed to an image pattern of activating radiation such as an image of visible light or writing by an electron beam, or the like. (See FIg. 6). In one specific instance, a pattern element was placed in contact with the silver surface and exposed to the output of a 400 W mercury arc lamp. measured at 2.3 mW/cm$^2$ by means of an International Light Photoresist Photometer for about 30 seconds. The exposed layer is then etched in concentrated ammonium hydroxide for about 30 seconds (as required to dissolve away the unexposed regions). The resulting product is element 10E of FIG. 7, comprising an arsenic trisulfide resist layer on a glass or quartz substrate.

This pattern on element 10E can be destroyed in whole or in part by flooding the entire surface, or large areas of it, for a period of 5 minutes with the same ultraviolet lamp and again etching with concentrated ammonium hydroxide.

We claim:

1. A photosensitive product for the formation of microlithographic resists, masks and the like comprising
   a substrate,
   a layer of an etchable chalcogenide glass on said substrate, and
   an extremely thin deposit of silver on the surface of said chalcogenide glass, said silver deposit being thinner than about 100 Å., said silver deposit being formed by depositing binderless silver halide thereon and photographically reducing and fixing said silver halide in the absence of exposure to activating radiation.

2. The photosensitive product of claim 1, wherein said product is essentially free from exposure to activating radiation.

3. The photosensitive product of claim 1, wherein said product is uniformly fogged by exposure to activating radiation in a quantity to bring about essentially full etch resistance in said chalcogenide glass,
   said product being characterized by photoresponse to activating radiation to reduce the etch resistance of said chalcogenide glass upon further exposure.

4. The photosensitive product of claim 1 wherein said chalcogenide glass is As$_2$ S$_3$.

5. The photosensitive product of claim 4, wherein said layer of As$_2$ S$_3$ comprises an under layer of As$_2$ S$_3$ exposed to ultraviolet light and a surface layer free from exposure to ultraviolet light.

6. A photosensitive resist for the formation of microlithographic resists, masks and the like comprising
   a substrate,
   a layer of an etchable chalcogenide glass vacuum evaporated on said substrate, and
   an extremely thin deposit of silver on the surface of said chalcogenide glass, said silver deposit being thinner than about 100 Å, said silver deposit being formed by depositing binderless silver halide in the absence of exposure to activating radiation.

7. The photosensitive resist of claim 6, wherein said chalcogenide glass is arsenic trisulfide.

8. As an intermediate product, a product for the formation of microlithographic resists, masks and the like, comprising the product of claim 4 having areas of etch-susceptible As$_2$ S$_3$ and areas of etch-resistant As$_2$ S$_3$, the areas of etch resistant As$_2$ S$_3$ corresponding to areas which are activated by a history of exposure to the radiation-containing portions of a pattern of light and shadow of said radiation.

9. A method of making a photosensitive product for the formation of microlithographic resists, masks and the like, comprising
   vacuum evaporating a chalcogenide glass on a substrate,
   depositing a binderless silver halide on the surface of said chalcogenide glass,
   partially reducing said silver halide, in the absence of photographic developer quantitatively sufficient to form an extremely thin layer of reduced silver less than 100 Å in thickness on said chalcogenide glass surface, and
   fixing said layer to remove silver halide,
   whereby a surface sensitized chalcogenide layer results, said layer being reversibly altered in etch resistance by exposure to moderate activating radiation.

10. The method of claim 9, wherein the chalcogenide glass is As$_2$ S$_3$.

11. The process of forming a pattern of chalcogenide glass comprising
   evaporating a layer of chalcogenide glass on a substrate,
   depositing a binderless silver halide on the surface of said chalcogenide glass to form a unitary product,
   in the absence of exposure to activiating radiation, developing said silver halide in a photographic developer quantitatively sufficient to form an extremely thin layer of reduced silver less than 100 Å in thickness,
   fixing said unitary product, thereby removing silver halide therefrom,
   exposing said product to a pattern of light and shadow to be reproduced, and
   etching said chalcogenide glass to form a pattern of said glass on the substrate, said pattern of glass corresponding to the pattern of light and shadow.

12. The process of claim 9 wherein said chalcogenide glass is As$_2$ S$_3$.

* * * * *